United States Patent
Evans et al.

(10) Patent No.: US 8,836,274 B2
(45) Date of Patent: Sep. 16, 2014

(54) SYSTEM AND METHOD FOR DISPLAYING BATTERY INFORMATION BEFORE EXECUTING AND OPERATING SYSTEM

(75) Inventors: Gregory John Evans, Merrickville (CA); Paul David Hedley, Bancroft (CA); Nader Newman, Brampton (CA); Danny Pacheco, Mississauga (CA); John Smids, Mississauga (CA); Hugo Krapf, Mississauga (CA)

(73) Assignee: PSION Inc., Mississauga, Ontario (CA)

( * ) Notice: Subject to any disclaimer, the term of this patent is extended or adjusted under 35 U.S.C. 154(b) by 440 days.

(21) Appl. No.: 12/767,734

(22) Filed: Apr. 26, 2010

(65) Prior Publication Data

US 2011/0264899 A1  Oct. 27, 2011

(51) Int. Cl.
*H02J 7/00* (2006.01)
*G01R 31/36* (2006.01)
*G06F 9/44* (2006.01)

(52) U.S. Cl.
CPC .............. *G01R 31/3682* (2013.01); *G06F 9/4401* (2013.01)
USPC ........................................................ 320/106

(58) Field of Classification Search
USPC ................................................. 320/DIG. 21
See application file for complete search history.

(56) References Cited

U.S. PATENT DOCUMENTS

| | | | | |
|---|---|---|---|---|
| 4,918,431 A | * | 4/1990 | Borras | 340/7.25 |
| 5,302,887 A | * | 4/1994 | Ishiguro et al. | 320/106 |
| 5,432,429 A | * | 7/1995 | Armstrong et al. | 320/136 |
| 5,691,742 A | * | 11/1997 | O'Connor et al. | 715/835 |
| 2006/0248363 A1 | | 11/2006 | Chen et al. | |
| 2009/0177922 A1 | * | 7/2009 | Eastman | 714/25 |

FOREIGN PATENT DOCUMENTS

| | | |
|---|---|---|
| EP | 0886204 A1 | 12/1998 |
| EP | 1353268 A1 | 10/2003 |
| GB | 2312049 A | 10/1998 |

OTHER PUBLICATIONS

European Search Report mailed Jan. 4, 2012 in counterpart European Patent Application No. 10193245.7.
Office Action for Counterpart European Patent Application No. 10193245.7 mailed on Jan. 8, 2013.

* cited by examiner

*Primary Examiner* — Arun Williams

(57) ABSTRACT

A system and method are described for displaying battery condition information on a display of a portable computer. After powering on the portable computer, battery condition information of a battery of the portable computer is retrieved. The retrieved battery condition information is displayed on the display of the portable computer and operating system (OS) loaded into an executable memory of the portable computer is executed.

15 Claims, 5 Drawing Sheets

SYSTEM AND METHOD FOR DISPLAYING BATTERY INFORMATION BEFORE EXECUTING AND OPERATING SYSTEM

TECHNICAL FIELD

The present disclosure generally relates to a system and method for displaying battery information, and in particular to a system and method of displaying battery information on a portable computer.

BACKGROUND

Portable computers are commonly used in a variety of different industries including for example, airports, automotive, food chain/cold chain, field service, government, passenger management, ports and container yards, postal and courier, retail and warehouse/distribution. The portable computers may be handheld computers that allow a user to perform a variety of tasks, such as bar code scanning, image capture, data input as well as to receive and review information.

When used in industry, a company or organization will typically employ tens, hundreds, thousands or more portable computers. In order to ensure that the portable computers are able to function continually, or for a long period of time, the portable computers use replaceable, and rechargeable batteries. A company or organization will typically have one or more spare replaceable batteries for each portable computer in order to ensure that a charged battery is always available.

Portable computers use an operating system (OS) in order to provide support for executing applications and other functions, as well as providing a user interface (UI). The user interface typically includes a graphical representation of the amount of power remaining of the battery. While the batter power indication provided by the UI is useful in gauging the amount of operating time remaining, it is not helpful in determining a state of a battery until the device is turned on and the OS is running, which can take a relatively long time.

While waiting for the OS to be running in order to determine the amount of power remaining in the battery is undesirable, other options exist. For example, chargers used to recharge the batteries may include various light emitting diodes (LEDs) or other indicators for indicating when the battery is fully charged. However, in order to function, the battery must be in the charger for a period of time. Additionally or alternatively, batteries may include a small display and accompanying electronics for displaying the state of the battery on the battery itself. However these systems can add to the cost and complexity of the battery. Furthermore the display and electronics may become broken or damaged easily.

Therefore there is a need for an improved system and method for displaying battery information for portable computers.

SUMMARY

In accordance with an aspect of the present disclosure there is provided a method of displaying battery condition information on a display of a portable computer. The method comprises the steps of powering on the portable computer; retrieving battery condition information of a battery of the portable computer; displaying the retrieved battery condition information on the display of the portable computer; and executing an operating system (OS) loaded into an executable memory of the portable computer.

In accordance with a further aspect of the present disclosure there is provided portable computer for displaying battery condition information. The portable computer comprises a display for displaying information; a non-volatile memory for storing instructions; a volatile memory for storing instructions; a processor for executing instructions stored in a portion of the non-volatile memory and the volatile memory and providing information for display; and a battery for providing power to at least the display, the non-volatile memory, the volatile memory and the processor. The instructions stored in the portion of the non-volatile memory, when executed by the processor, configuring the portable computer to retrieve battery condition information from the battery; display the retrieved battery condition information on the display; and execute an operating system (OS) loaded into the volatile memory once an indication to proceed has been received.

BRIEF DESCRIPTION OF THE DRAWINGS

Further features and advantages will become apparent from the following detailed description, in combination with the appended drawings in which.

DETAILED DESCRIPTION

Portable computers are commonly used in a variety of different industries including for example, airports, automotive, food chain/cold chain, field service, government, passenger management, ports and container yards, postal and courier, retail and warehouse/distribution. The portable computers may be handheld computers, vehicle mount computers, or other types of portable computers that allow a user to perform a variety of tasks, such as bar code scanning, image capture, data input as well as to receive and review information. The portable computers include a battery that can be removed and replaced. The replaceable battery may form a seal with the computer housing and provide an exterior surface of a portion of the portable computer housing. Alternatively, the battery may be housed within sealable compartment of the housing of the portable computer and may require the removing, or opening, of a door, latch or similar covering in order to remove and replace the battery. As described further herein, when a replacement battery is inserted into the portable computer battery information may be displayed on a display of the computer.

Figure 1:
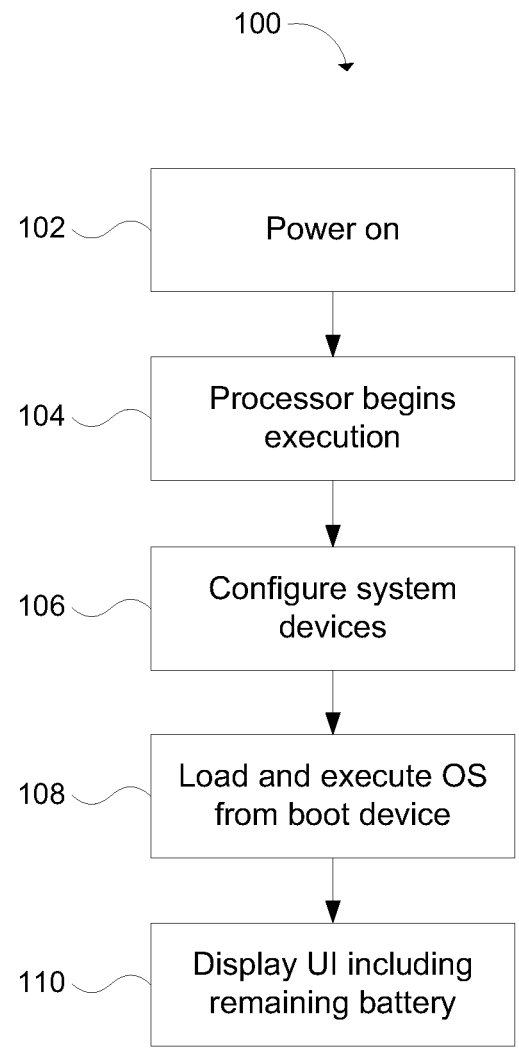
FIG. 1 depicts a previous method of displaying battery information on a display of a portable device.

FIG. 1 depicts a previous method 100 of displaying battery information on a display of a portable device. The method 100 begins with the portable computer being powered on (102). After powering on the device, the processor begins executing instructions (104). The instructions may perform various self tests and configure the portable computer. In general, the processor configures the portable computer in order to provide basic functionality (106). After the basic configuration is completed, a boot device is located that stores an operating system (OS) that is to be loaded. The boot device may be a non-volatile storage device, such as a Flash memory disk, a read only memory (ROM), a hard disk drive (HDD), a solid state drive (SSD), or other types of non-volatile storage devices. After locating the boot device, the method loads and executes an operating system (OS) (108) from the boot device. The OS provides an environment for applications to execute in. The OS typically includes functionality for presenting a user interface (UI) to the user on a display of the portable computer. Once the OS is operating, it can display the UI, which may include an indication of the remaining battery power left (110). Alternatively, if the UI of the OS does not provide an indication of battery information, it is possible for a separate battery application to be executed, which displays the battery information.

While previous methods of displaying battery information on a portable computer may be useful to display the operating condition of a battery to a user, they are time consuming to use when attempting to determine battery information of a replacement battery, since the user must wait until the operating system is operating in order to view an indication of the remaining battery power on the UI of the OS.

Figure 2:
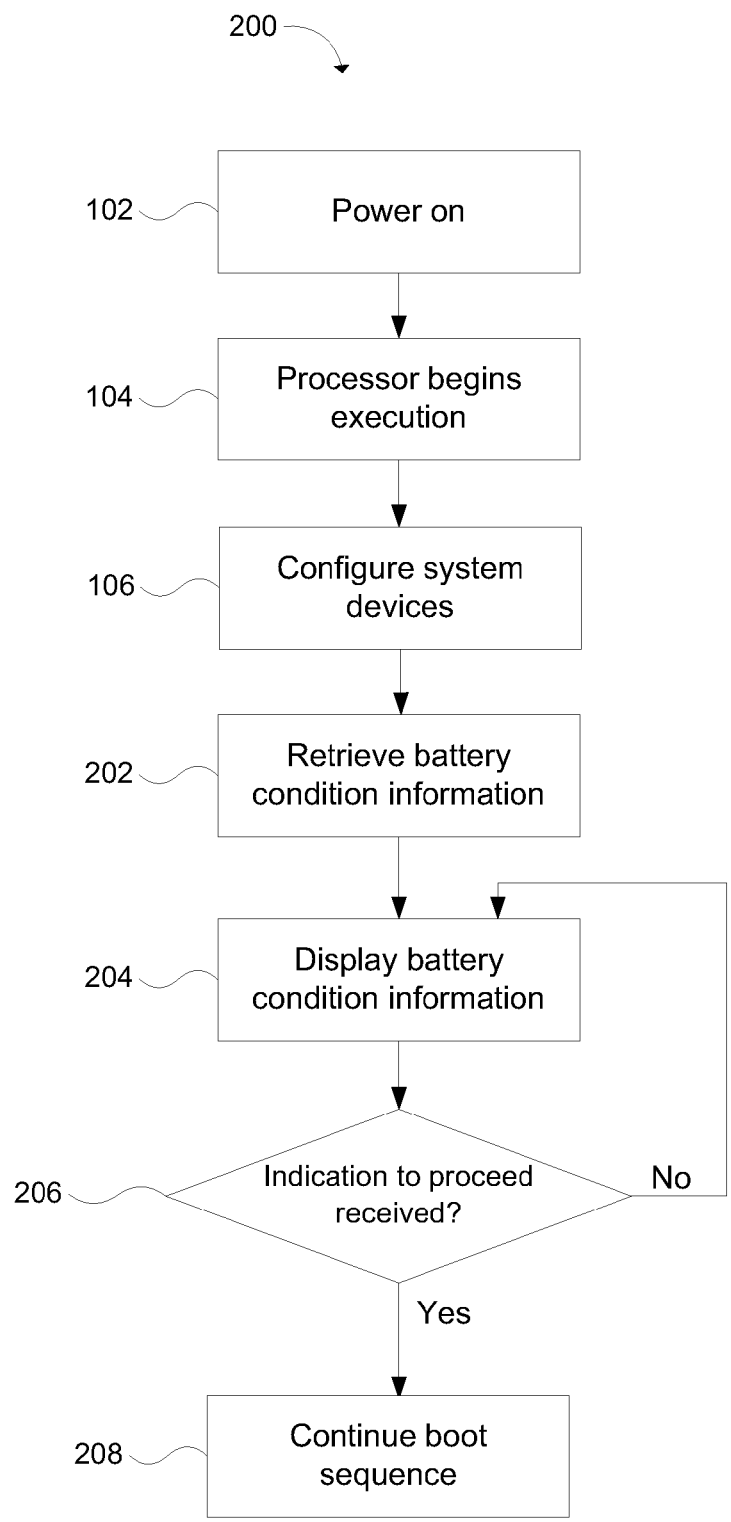
FIG. 2 depicts an illustrative method of displaying battery condition information on a display of a portable computer.

FIG. 2 depicts an illustrative method of displaying battery condition information on a display of a portable computer. The beginning of the method 200 is similar previous methods, such as 100. The method 200 begins with the device being powered on (102), starting execution of the processor (104) and configuring the system devices to provide basic functionality (106). The method 200 retrieves battery condition information (202) from the battery. The battery condition information may be determined from a component of the portable computer, for example, a meter may be used to determine the voltage that, is supplied by the battery. Additional battery condition information may include, for example the cycle count of the battery, the capacity of the battery, and other battery information. The battery condition information may be determined indirectly from the battery, for example by measuring battery characteristics. Additionally or alternatively battery condition information may be stored in a memory of the battery itself, for example in a smart battery. Once the battery condition information is retrieved, it is displayed on the portable computer (204). The battery condition information may be displayed in various ways, for example, the display of the portable computer may include a dedicated portion for displaying the battery condition information prior to running the OS. Additionally or alternatively, the portable computer may be configured to display the battery information using the display, for example, as a graphic, text based message, or combination of text and graphics. After the battery condition information is displayed the method 200 determines if an indication to proceed has been received (206). The indication to proceed may be for example, a user pressing a key on the portable device, or the expiration of a timer. If no indication to proceed has been received (No at 206), the method continues displaying the battery condition information (204). If an indication to proceed has been received (Yes at 206), the method continues with the booting sequence (208). As described with reference to FIG. 1 continuing the boot sequence may involve locating a boot device, loading an OS from the boot device and executing the OS.

As described above with reference to FIG. 2, the method 200 may display the battery condition information on the portable computer to the user before the OS of the portable computer is loaded. By displaying the battery condition information prior to loading the OS, it is possible to display the battery condition information with a shorter time delay between powering on the portable computer and displaying the battery condition information. This may allow the portable computer to be used when assessing the suitability of a particular battery for selection.

By way of example, a user of a portable computer that is used in a cold storage setting may select a battery to use in the portable computer for the duration of a shift. Upon inserting the selected battery into the device, the portable computer powers on, retrieves and displays the battery condition information, the user may see that the battery is unsuitable for use and select another battery. Again, upon insertion of the battery, the portable computer may power on, retrieve the battery condition information and display it. The user may see that the selected battery is suitable for use for a shift an give an indication to proceed, for example by hitting a key on the portable computer. Upon receiving the indication to proceed, the portable computer continues the boot sequence, for example by locating a boot device, loading and executing an operating system from the boot device.

As will be appreciated from the above, it is possible to provide battery condition information to a user of a portable computer quickly using the portable computer. As such, it is not necessary to include, for example a display or visual indication of the state of the battery on the battery itself, which may reduce the cost or complexity of the device. Additionally or alternatively, it may reduce or remove components of a battery, such as battery state displays, which may break.

Figure 3:
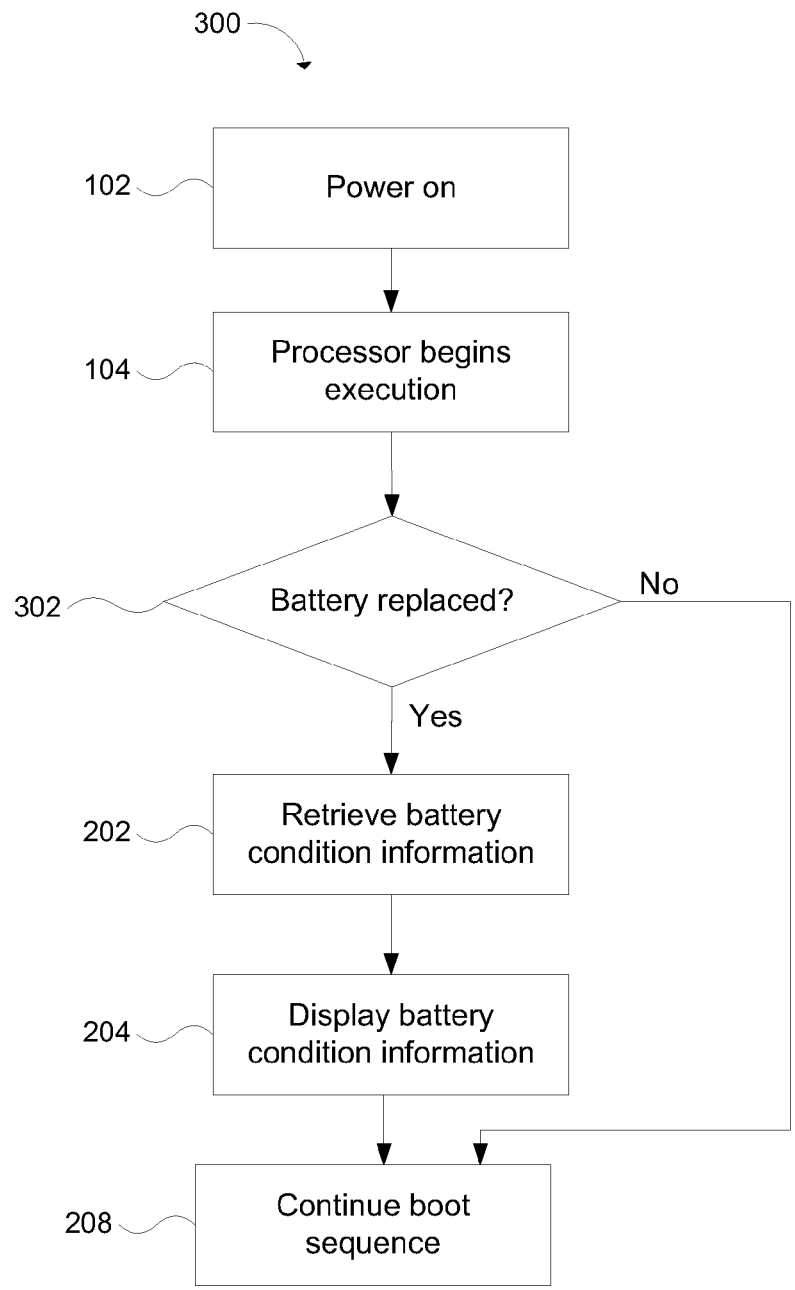
FIG. 3 depicts an illustrative method of displaying battery information on a display of a portable computer.

FIG. 3 depicts an illustrative method of displaying battery information on a display of a portable computer. Similar to the methods described above with reference to FIGS. 1 and 2, the method 300 begins with the portable computer being powered on (102). The portable computer may be powered on in various ways. For example, the portable computer may be powered on by pressing a power button on the portable computer, or the portable device may be powered on by inserting a battery, assuming the inserted battery has sufficient charge to power the portable computer. After powering on, the processor of the portable device begins execution (104). The processor may perform various self-tests and configurations. The method 300 checks to determine if the battery has been replaced (302). The method may determine if the battery has been replaced in various ways, for example, the battery may include a unique identifier that the portable computer stores and compares to the battery. If the stored battery ID does not match the ID of the inserted battery than it can be assumed that the battery was changed. Alternatively, the battery may be used to maintain a state of a component, so that when the battery is removed, the state of the component changes. Upon determining if the battery has been replaced, the portable computer may check the state of the component. The component may be, for example a register, a value in a memory location, a charge on a capacitor or other components whose state is maintain when a battery is present but changes when the battery is removed or replaced.

If the battery is determined to have been replaced (Yes at 302), the method 300 may retrieve the battery information (202) and display the battery condition information on the portable computer (204) as described above with reference to FIG. 2. After the battery condition information is displayed the boot sequence continues (208). The boot sequence may involve locating a boot device and loading and executing an OS from the boot device. If it is determined that the battery has not been changed (No at 302), the method does not retrieve and display the battery condition information, but rather proceeds to continue the boot sequence (208).

Although different illustrative methods have been described above with reference to FIGS. 2 and 3, it will be appreciated that the methods may be combined. For example, a combined method may determine if the battery has been replaced, as well as determining if an indication to proceed has been received. Alternatively, it is possible for the method to not check to determine if the battery has been replaced, display the battery condition information and proceed with the boot sequence without receiving an indication to proceed.

Figure 4:
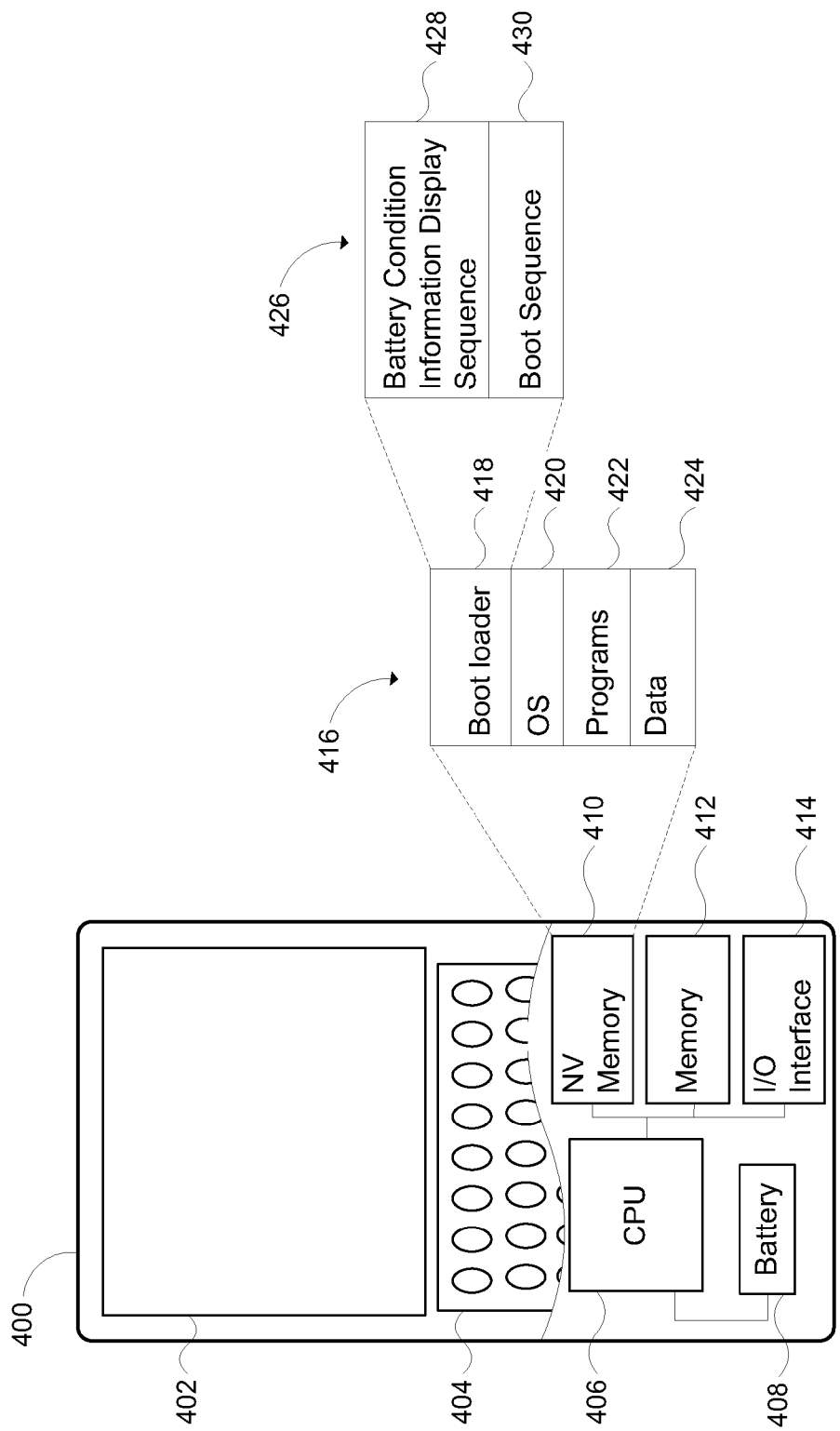
FIG. 4 depicts a schematic of a portable computer implementing an illustrative method of displaying battery condition information.

FIG. 4 depicts a schematic of a portable computer implementing an illustrative method of displaying battery condition information. The portable computer 400 is depicted having the general shape of a handheld computer; however other form factors are possible as well. The portable computer 400 includes a display 402 and an input device 404. The display 402 is suitable for displaying different types of information to a user, such as text and graphics of a UI. The input device 404 is depicted as a keypad; however other types of input devices are possible, such as a track ball, an optical track pad, a touch sensitive device, voice control. The display 402 and the input device 404 provide for the output and input of information and cooperate with other components of the portable computer 400. The portable computer 400 further includes a processor such as a central processing unit (CPU), microcontroller, or other controller 406. The processor 406 can execute instructions. The processor 406 is coupled to non-volatile memory 410 and volatile memory 412. Although the non-volatile memory 410 is depicted as a single component, it may comprise multiple components. For example the non-volatile memory 410 of the portable computer 400 may include read only memory (ROM), a flash memory device; a hard disk drive (HDD), a solid state drive (SSD), other non-volatile memory or combinations thereof. Similarly, the memory 412 may comprise one or more components, including random access memory (RAM). In addition to the non-volatile memory 410 and the memory 412, the processor 406 may also be coupled to one or more additional components such as an input/output (I/O) interface 414 for coupling input or output device to the portable computer 400. A battery 408 provides the power to the components in order for the portable computer to function. Although the battery 408 is depicted as being attached only to the processor 406, it may be coupled either directly, or indirectly to other components of the portable computer 400.

The non-volatile memory stores instructions 416 that are executed by the processor in order to provide functionality to the portable computer 400. The instructions stored in the non-volatile memory 410 may be executed directly by the processor 406, or they may need to be loaded from the non-volatile memory to RAM prior to being executed by the processor. For example, if the instructions are stored in ROM, the processor 406 may be able to execute the instructions directly, while if the instructions are stored on, for example a HDD or SSD, they may need to be first loaded into RAM in order to be executed by the processor of the portable computer 400.

Regardless of the type of non-volatile memory the instructions are stored in, they provide different functionality to the portable computer when executed by the processor. The instructions 416 may include a segment that provides a boot loader 418, a segment that provides an OS 420, a segment that provides applications 422 for executing in the OS, and data 424.

When powering on, the processor begins executing the boot loader instructions, which are stored at set location so that the processor can locate them. The boot loader 418 may comprise various instructions 426. The boot loader may include a battery condition information display segment 428, which may retrieve and display battery condition information on the portable computer 400. The boot loader may also include boot sequence instructions 430. The boot sequence instructions 430 provide instructions for locating a boot device, which may be a non-volatile memory component, loading the OS instructions 420 into RAM and causing the processor to execute the OS instructions loaded into RAM.

As described above, the boot sequence may locate a boot device, load an OS from the boot device into RAM, and then execute the OS. This boot sequence may be performed when the portable computer has been completely powered off, for example after a cold reboot, or after all the power of the battery has been drained. It is possible that the portable computer may have a short term power supply for maintaining a system state for a period of time without the battery present, or with the battery completely depleted. As such, the battery may be replaced without having to reboot the portable computer. However if the portable computer is without power, whether from the battery or another surface for a prolonged period of time, the contents of the RAM will be destroyed. As such, upon powering on, when the processor begins executing the boot loader will eventually have to load the OS back into RAM. In such a case the boot sequence may be similar to that described above. For example, the portable computer may be powered on, the processor may begin executing which loads the boot loader instructions. The boot loader may execute the instructions for displaying the battery condition information on the portable computer. The boot loader instructions may locate a boot device, and load an OS from the boot device into RAM and cause the processor to execute the instructions loaded into RAM.

Alternatively, the portable computer may perform a soft reboot, in which case the OS instructions are maintained in the RAM. For example, in some portable computers when the device is turned off, the device enters a low powered sleep mode, that maintains the contents of RAM, but stops all the other functions. When the portable computer is turned off in this manner, the OS may write information to a particular location indicating that the OS instructions are still in the RAM. In such a case the boot sequence differs in that the boot loader does not need to load the OS instructions from the non-volatile memory into RAM. Rather the boot loader may cause the processor to retrieve and display the battery condition information and then execute the OS instructions already present in RAM.

Although a particular embodiment has been described above with reference to FIG. 4, other embodiments are possible. For example, the battery condition information display instructions have been described as forming part of the boot loader instructions. It is possible to have the boot loader, or possibly the basic input output system (BIOS), load and execute the battery condition information display instructions as though they were an OS, then having the battery condition information display instructions load and execute the OS.

Figure 5:
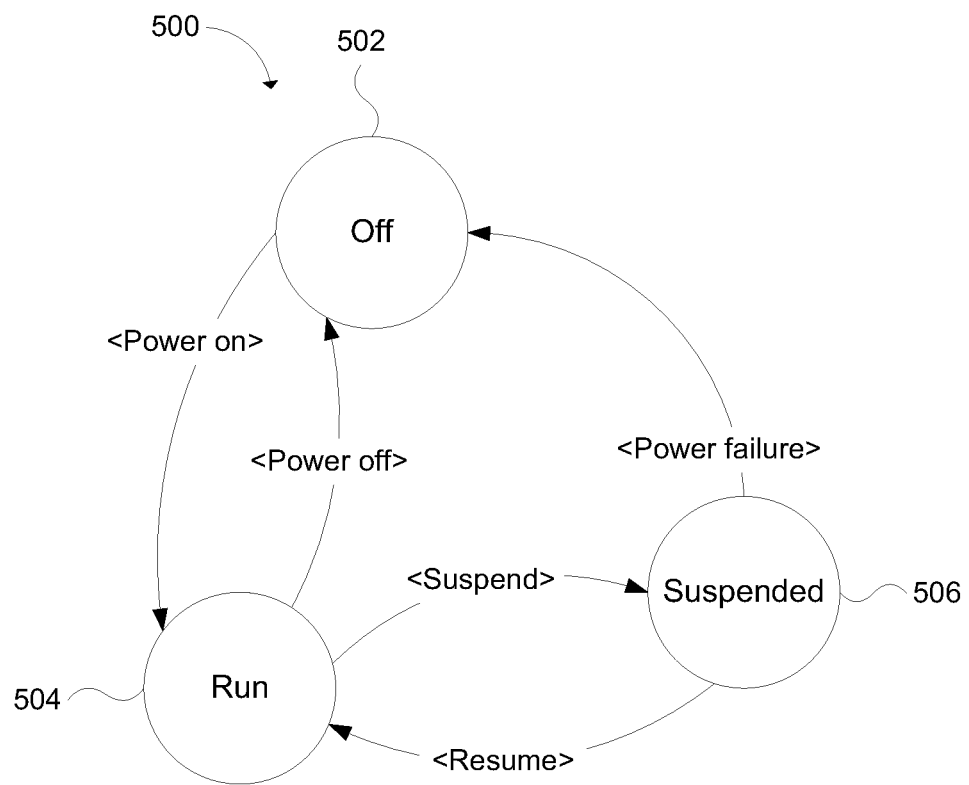
FIG. 5 depicts a state diagram of illustrative states of a portable computer.

FIG. 5 depicts a state diagram 500 of illustrative states of a portable computer The portable computer may be in an Off state 502, a Running state 504 or a Suspended state 506. The portable computer is in the Off state 502 when it is completely drained of power, or when a cold reboot is performed. In the Off state 502, all contents of the volatile memory are destroyed. The portable computer is in the Suspended state 506 when it is turned off, put to sleep or hibernation. In the Suspended state 506 all processing is halted; however, unlike in the Off state 502, the contents of RAM are maintained. The computer is in the Running state 504 when it is powered on and the OS is executing. The Running state 502 would be generally associated with the normal functioning of the portable computer, for example allowing a user to execute an application. As depicted in FIG. 5, different events can cause a transition between states. For example the portable computer may transition from the Off state 502 to the Running state 504 when a power on event occurs. Similarly, the portable computer may transition from the Running state 504 to the Off state when a power off event occurs. The portable computer may transition from the running state to the Suspended state 506 when a suspend event occurs, and may transition from the Suspended state 506 to the Running state 504 when a resume event occurs. The portable computer may transition from the Suspended state 506 to the Off state, when a power failure event occurs. Typically a portable computer will not transition from the Off state 502 to the Suspended state 506.

When transitioning to the Running state 504, from either the Off state 502 or the Suspended state 506, the portable computer will power on, the processor will begin executing instructions which will include the instructions for retrieving and displaying battery condition information as described above, and then will check to determine if the portable computer was in the Suspended state or the Off state. If the portable computer was in the Off state, the processor executes instructions that load an OS from non-volatile memory into RAM and cause the processor to execute the loaded instructions. If the portable computer was in the Suspended state, the processor executes the OS instructions that are already present in the RAM.

As described above, regardless of if the portable computer is powering on from an Off state or a suspended state, it is possible to quickly display the battery condition information. This may be useful, since in some portable computers it is possible to replace a battery without causing a power failure. As such, if the device is in the suspended state, and the battery is changed, it may be desirable to display the battery condition information.

What is claimed is:

1. A method of displaying battery condition information on a display of a portable computer, the method comprising:
   powering on the portable computer;
   detecting whether an existing battery of the portable computer has been replaced with a battery that is different than the existing battery;
   retrieving battery condition information of the replaced battery when the existing battery is detected to have been replaced, the battery condition information comprising a current charge of the battery;
   displaying the retrieved battery condition information on the display of the portable computer; and
   executing an operating system (OS) loaded into an executable memory of the portable computer once an indication to proceed has been received.

2. The method as claimed in claim 1, wherein the battery condition information further comprises one or more of:
   a voltage of the battery;
   a number of charge/discharge cycles of the battery; and
   a maximum charge associated with the battery.

3. The method as claimed in claim 1, further comprising:
   configuring the basic input/output devices of the portable computer before retrieving the battery condition information.

4. The method as claimed in claim 1, further comprising:
   determining if the portable computer was in an off state, in which the contents of the executable memory are destroyed, or in a suspended state, in which the contents of the executable memory are maintained.

5. The method as claimed in claim 4, further comprising:
   executing the OS loaded into the executable memory when the portable computer was in the suspended state; or
   loading the OS into the executable memory from a non-volatile memory of the portable computer when the portable computer was in the off state and executing the OS loaded into the executable memory.

6. The method as claimed in claim 1, wherein the indication to proceed comprises at least one of:
   a key press by a user of the portable computer;
   an expiration of a timer; or
   an expiration of a timer without receiving any input from the user of the portable computer.

7. The method as claimed in claim 1, wherein detecting that the existing battery has been replaced comprises at least one of:
   comparing a first identifier of an inserted battery to a second identifier stored in the portable computer and determining that the existing battery has been replaced when the first identifier does not match the second identifier; and
   checking a state of a component of the portable computer whose state is maintained when a battery is present but changes when the battery is removed or replaced.

8. A portable computer for displaying battery condition information, the portable computer comprising:
   a display for displaying information;
   a non-volatile memory for storing instructions;
   a volatile memory for storing instructions;
   a processor for executing instructions stored in a portion of the non-volatile memory and the volatile memory and providing information for display; and
   an existing battery for providing power to at least the display, the non-volatile memory, the volatile memory and the processor,
   the instructions stored in the portion of the non-volatile memory, when executed by the processor, configuring the portable computer to:
   detect if the existing battery has been replaced with a battery that is different than the existing battery;
   retrieve battery condition information from the replaced battery when the existing battery is detected to have been replaced, the battery condition information comprising a current charge of the battery;
   display the retrieved battery condition information on the display; and
   execute an operating system (OS) loaded into the volatile memory once an indication to proceed has been received.

9. The portable device as claimed in claim 8, wherein the battery condition information comprises one or more of:
   a voltage of the battery;
   a number of charge/discharge cycles of the battery; and
   a maximum charge associated with the battery.

10. The portable computer as claimed in claim 8, wherein the battery condition information is determined by a component of the portable computer based on the electrical characteristics of the battery.

11. The portable computer as claimed in claim 8, wherein the battery condition information is stored in the battery and retrieved by the processor of the portable computer.

12. The portable computer as claimed in claim 8, wherein the instructions stored in the portion of the non-volatile memory, further configure the portable computer to:
   configure the basic input output system of the portable computer upon powering on the portable computer.

13. The portable computer as claimed in claim 8, wherein the detecting if the existing battery has been replaced comprises at least one of:

comparing a first identifier of an inserted battery to a second identifier stored in the portable computer and determining that the existing battery has been replaced when the first identifier does not match the second identifier; and checking a state of a component of the portable computer whose state is maintained when a battery is present but changes when the battery is removed or replaced.

14. The portable computer as claimed in claim 8, wherein the indication to proceed comprises at least one of:

a key press by a user of the portable computer;

an expiration of a timer; or an expiration of a timer without receiving any input from the user of the portable computer.

15. The portable computer as claimed in claim 8, wherein the instructions stored in the portion of the non-volatile memory, further configure the portable computer to:

determine if the portable computer was in an off state, in which the contents of the executable memory are destroyed, or in a suspended state, in which the contents of the executable memory are maintained; and execute the OS loaded into the executable memory when the portable computer was in the suspended state, or load the OS into the executable memory from a non-volatile memory of the portable computer when the portable computer was in the off state and executing the OS loaded into the executable memory.

* * * * *